United States Patent
Camponeschi et al.

(10) Patent No.: US 12,003,248 B2
(45) Date of Patent: Jun. 4, 2024

(54) TRANSCEIVER AND METHOD AND SYSTEM FOR CONTROLLING AN ANALOG-TO-DIGITAL CONVERTER IN AN OBSERVATION PATH IN THE TRANSCEIVER

(71) Applicant: Intel Corporation, Santa Clara, CA (US)

(72) Inventors: Matteo Camponeschi, Villach (AT); Albert Molina, Novelda (ES); Kannan Rajamani, Edison, NJ (US); Giacomo Cascio, Villach (AT); Christian Lindholm, Villach (AT)

(73) Assignee: Intel Corporation, Santa Clara, CA (US)

( * ) Notice: Subject to any disclaimer, the term of this patent is extended or adjusted under 35 U.S.C. 154(b) by 651 days.

(21) Appl. No.: 17/131,819

(22) Filed: Dec. 23, 2020

(65) Prior Publication Data

US 2022/0200616 A1  Jun. 23, 2022

(51) Int. Cl.
*H04W 4/80* (2018.01)
*H03M 1/10* (2006.01)
(Continued)

(52) U.S. Cl.
CPC ............ *H03M 1/1009* (2013.01); *H04B 1/40* (2013.01); *H04L 5/0048* (2013.01)

(58) Field of Classification Search
CPC ... H04W 4/80; H04W 52/0235; H04W 88/06; H04W 48/16; H04W 52/00;
(Continued)

(56) References Cited

U.S. PATENT DOCUMENTS 8,706,062 B1 * 4/2014 Yu ........................... H03F 3/245
455/127.1
10,057,864 B2   8/2018 Su et al.
(Continued)

OTHER PUBLICATIONS

Moslem Rashidi: "Non-uniform sampling and reconstruction of multi-band signals and its application in wideband spectrum sensing of cognitive radio", Oct. 11, 2010 (Oct. 11, 2010), pp. 1-58, XP055485160, Retrieved from the Internet: URL:https://arxiv.org/ftp/arxiv/papers/1010/1010.2158.pdf [retrieved on Jun. 18, 2018] * abstract * * section I; figure 3 * * equations 1-3; p. 2, right-hand column, paragraph 2 *.
(Continued)

*Primary Examiner* — Eva Y Puente
(74) *Attorney, Agent, or Firm* — 2SPL Patent Attorneys PartG mbH; Yong Beom Hwang

(57) ABSTRACT

A method and system for controlling an analog-to-digital converter (ADC) in an observation path in a transceiver. The transceiver includes a transmit path, a receive path, and an observation path. The observation path includes an analog buffer and an observation ADC. A controller generates a control signal to control sampling events at the observation ADC to activate the observation ADC at combined uniform and non-uniform sampling instants. The controller may also generate a second control signal indicating whether digital data obtained by the observation ADC is valid or not. The digital data generated by the observation ADC at non-uniform sampling instants is indicated as invalid and digital data generated by the observation ADC at uniform sampling instants is indicated as valid. The digital data indicated as invalid may be discarded and the digital data indicated as valid is used for calibration of the transmit path or the receive path.

23 Claims, 12 Drawing Sheets

(51) Int. Cl.
*H04B 1/40* (2015.01)
*H04L 5/00* (2006.01)

(58) Field of Classification Search
CPC ........... H04W 52/029; H04W 52/0293; H04W 24/02; H04B 1/28; H04B 1/0007; H04B 1/3805; H04B 1/00; H04B 2001/3894; H04B 1/40; H04B 1/1027; H04B 1/0475; H04B 5/79; H03M 1/201; H03M 3/332; H03M 3/396; H03M 3/406; H03M 3/456
USPC .......................................................... 375/219
See application file for complete search history.

(56) References Cited

U.S. PATENT DOCUMENTS

| | | | |
|---|---|---|---|
| 2015/0030103 A1* | 1/2015 | Hormis | H04L 1/243 375/296 |
| 2015/0236739 A1* | 8/2015 | Montalvo | H03M 1/0626 455/307 |
| 2017/0346509 A1* | 11/2017 | Sulimarski | H04B 1/0475 |
| 2022/0200838 A1* | 6/2022 | Azadet | H03D 3/009 |

OTHER PUBLICATIONS

Dos Santos Filipe Vinci et al: "Flexible Wideband Radio Transceiver Testing using Non-Uniform Subsampling Demodulation", 2018 IEEE International Symposium On Circuits and Systems (ISCAS), IEEE, May 27, 2018 (May 27, 2018), pp. 1-5, XP033434907, DOI: 10.1109/ISCAS.2018.8351463 [retrieved on Apr. 26, 2018] * section 1.3; figure 1.4 *.

Mabrook M. Mourad et al: "Novel adaptive non-uniform sub-Nyquist sampling technique for cooperative wideband spectrum sensing", 2016 12th International Computer Engineering Conference (ICENCO), [Online] Dec. 29, 2016 (Dec. 29. 2016), pp. 20-25, XP055919711, DOI: 10.1109/ICENCO.2016.7856439 ISBN: 978-1-5090-2863-4 [retrieved on May 10, 2022] * figure 2 *.

* cited by examiner

TRANSCEIVER AND METHOD AND SYSTEM FOR CONTROLLING AN ANALOG-TO-DIGITAL CONVERTER IN AN OBSERVATION PATH IN THE TRANSCEIVER

FIELD

Examples relate to a transceiver, more particularly a transceiver and a method and system for controlling an analog-to-digital converter (ADC) in an observation path in the transceiver.

BACKGROUND

In a multi-GHz transceiver, a receiver (RX) and transmitter (TX) output signal may be corrupted due to various kinds of imperfections of an ADC in the RX or in a digital-to-analog converter (DAC) in the TX or other non-linear devices. In a receiver, a non-linear distortion in the input analog buffer preceding the ADC introduces spurious tones in the ADC output spectrum, which degrades the spurious-free dynamic range (SFDR). Due to bandwidth limitations, memory effects are observed at the upper band-edge of the receiver. In a transmitter, a non-linear distortion and memory effects of the DAC output stage cause spectral regrowth and a potential violation of the output emission mask, which impacts on the overall efficiency of the transmitter. These effects are particularly severe at high signal levels and critical for wideband operation. In both cases, a degradation in the error vector magnitude (EVM) is observed.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
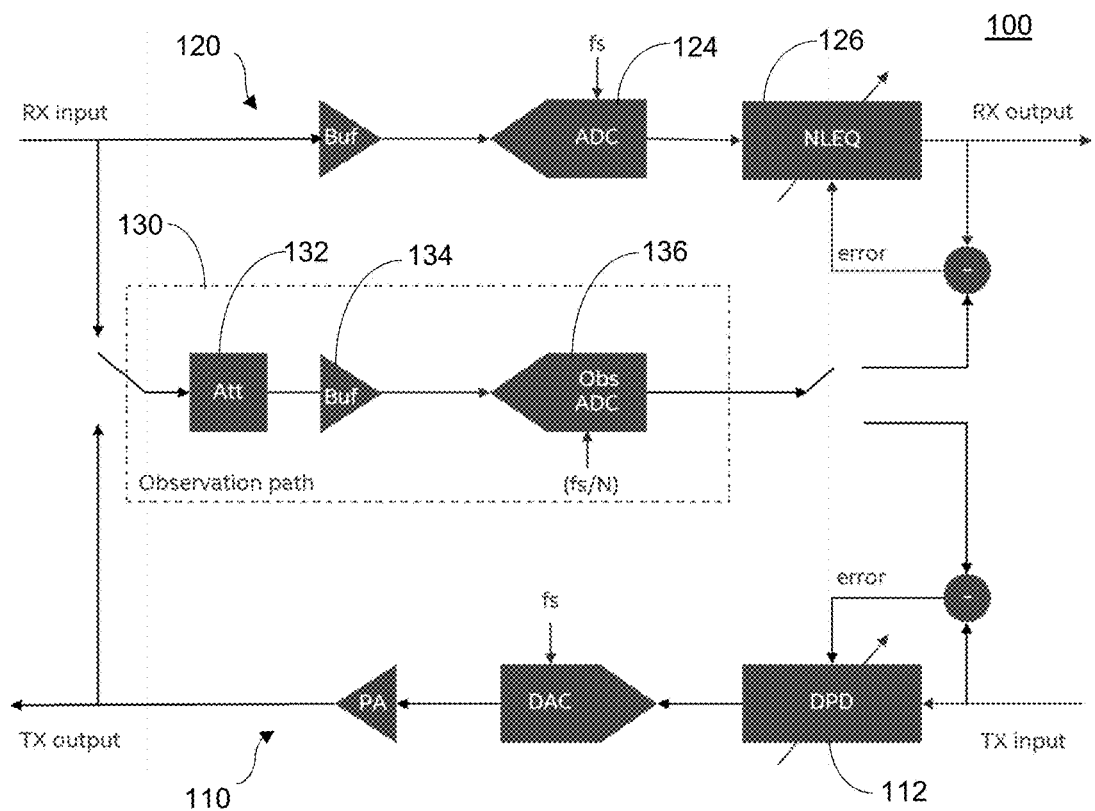
FIG. 1 shows a transceiver with an observation path for receiver/transmitter (RX/TX) calibration.

FIG. 1 shows a transceiver 100 with an observation path 130 for receiver/transmitter (RX/TX) calibration. The transceiver 100 includes a TX path 110, an RX path 120, and an observation path 130. The observation path 130 is provided for calibration of the TX path 110 and the RX path 120. The observation path 130 may be an additional receiver path or one of the existing receiver paths used for the background calibration of a high-speed RF transceiver. The observation path 130 is provided in parallel to the main RX and TX paths 110, 120. The observation path 130 may include an attenuator 132, an input buffer 134, an ADC 136 (hereafter referred to as "observation ADC").

During RX calibration, the observation path 130 senses the signal at the input of the RX path 120 and creates a reference signal which is used to correct the main RX output signal through a non-linear equalizer (NLEQ) 126. During TX calibration, the observation path 130 senses the signal at the output of the TX path 110 and sends a reference signal for digital pre-distortion (DPD) 112 of the transmit signal.

The quality of the achievable RX/TX calibration is directly related to the quality of the signal at the output of the observation path 130. Therefore, the goal is to create the most possible accurate replica of the signal at the input of the observation path 130, minimize a non-linear distortion (linearity can be increased by attenuating the input signal and operating at back-off), avoid memory effects (a wideband observation path needs to be provided), and guarantee a high dynamic range (e.g. dithering may be employed to turn ADC spurs into noise and increase the SFDR). In general, the requirements for the observation ADC 136 are different from the ADC 124 of the main RX path and a different buffer/ADC architecture may be employed for the observation path 130.

The observation path 130 does not need to operate at the full rate of the ADC 124 in the main RX path 120, but may be operated by subsampling the input signal, as far as the dynamics/changes of the input signal are slow compared to the sampling rate of the observation path 130. The observation path 130 needs to operate with some sort of non-uniform sampling to reconstruct the full spectrum of the wideband input signal. Under the non-uniform sampling samples are taken non-periodically, i.e. with randomly varying sampling periods.

Figure 2:
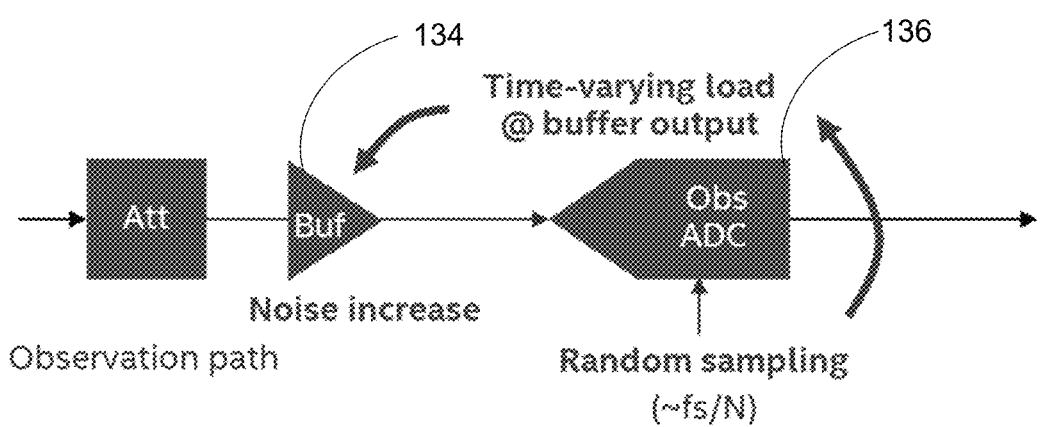
FIG. 2 shows that irregular random sampling at the observation ADC incurs time-varying load at the buffer output and generates random transients at the output of the analog buffer.

The irregular activation of the observation ADC 136, however, generates a time-varying load for the input buffer 134 preceding the observation ADC 136 in the observation path 130. This causes random transients at the output of the buffer 134. In multi-GHz operation these transients translate into a noise increase at the buffer/ADC interface, causing a severe degradation of the dynamic range at the observation path output. FIG. 2 shows that irregular random sampling at the observation ADC 136 incurs time-varying load at the buffer output and generates random transients at the output of the analog buffer 134. This leads to noise increase and degradation of the performance. Since the observation ADC output signal is used as a reference for the NLEQ and DPD adaptations, this degradation limits the ability of digitally correcting the RX and TX data streams.

In order to solve the above problems, the ADC 136 in the observation path 130 may operate in uniform sampling. Under the uniform sampling, samples are taken periodically, i.e. with a fixed sampling period. However, in order to observe a wideband signal, this translates into a high data rate requirement, and increased sampling frequency and power dissipation in the ADC in the observation path.

Alternatively, the strength or driving capabilities of the buffer 134 preceding the observation ADC 136 in the observation path 130 may be increased. However, this leads to increased power dissipation in the buffer in the observation path.

Alternatively, a dummy ADC sampler may be added at the output of the buffer 134 which, although not delivering data for the RX/TX calibration, is activated in a way of keeping the load of the ADC-buffer constant over time ("dummy sampler"). However, this increases complexity of the overall system, as an extra sampler (area, power) and a proper logic to control its activation (complexity) is required.

Examples are disclosed for a transceiver configured to implement a combined uniform and non-uniform sampling scheme in an observation path, and a method and system for controlling an observation ADC in an observation path in the transceiver. The example schemes disclosed herein exploit the fact that the NLEQ and DPD adaptations in a transceiver are slow processes compared to the main RX/TX operations, and the NLEQ and DPD adaptation processes do not require a full-rate data stream but may operate with just an irregularly spaced subset of the full-rate data stream. Under these conditions, some samples at the output of the observation path may be skipped when performing the RX/TX calibration.

In examples disclosed herein, the ADC in the observation path may be activated by properly combining uniform and non-uniform sampling. This sampling scheme is hereinafter referred to as "constrained non-uniform sampling." In some examples, while non-uniform sampling is used to observe a wideband input signal, the corresponding ADC samples obtained by non-uniform sampling (which are affected by random transients) may be disregarded/discarded and only the samples acquired under uniform sampling may be used for subsequent processing, such as NLEQ or DPD adaptation.

Figure 3:
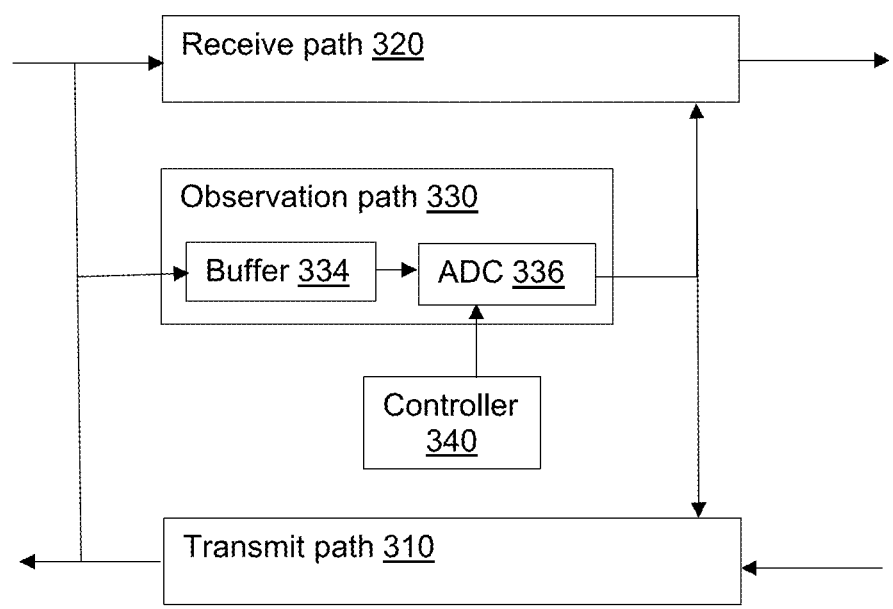
FIG. 3 is a block diagram of a transceiver in accordance with one example.

FIG. 3 is a block diagram of a transceiver 300 in accordance with one example. The transceiver 300 may be included in a user device or a base station or any network device. The transceiver 300 includes a transmit path 310, a receive path 320, an observation path 330, and a controller 340. The transmit path 310 includes circuitries configured to process a transmit signal, such as a digital pre-distortion (DPD) circuitry, a DAC, a power amplifier (PA), etc. The receive path 320 includes circuitries configured to process a receive signal, such as a buffer, an ADC, a non-linear equalizer (NLEQ). The observation path 330 includes circuitries configured to supply a reference signal for calibration of the transmit path and/or the receive path (e.g. for adaptation of DPD and/or NLEQ). The observation path 330 may include an analog buffer 334 and an ADC 336 (hereafter referred to as "observation ADC"). The analog buffer 334 is configured to supply a signal sensed from the transmit path 310 or the receive path 320. The observation ADC 336 is configured to digitize the signal supplied from the analog buffer 334. The controller 340 is configured to generate a control signal to control sampling events at the observation ADC 336 and send the control signal to the observation ADC 336 to activate the observation ADC 336 at combined uniform and non-uniform sampling instants.

Figure 5A:
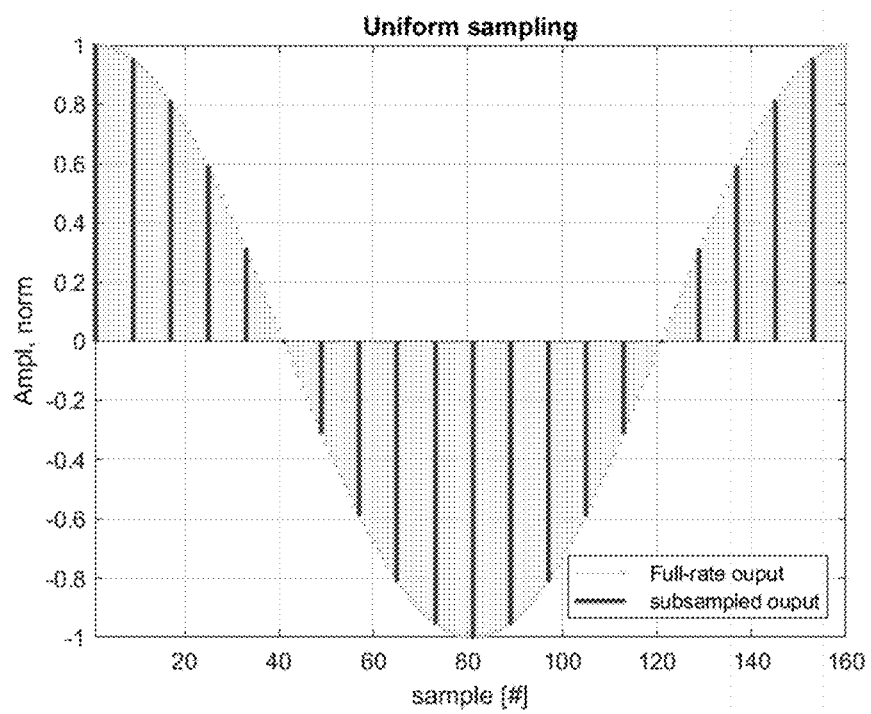
FIGS. 5A and 5B show uniform and non-uniform sampling, respectively.
Figure 5B:
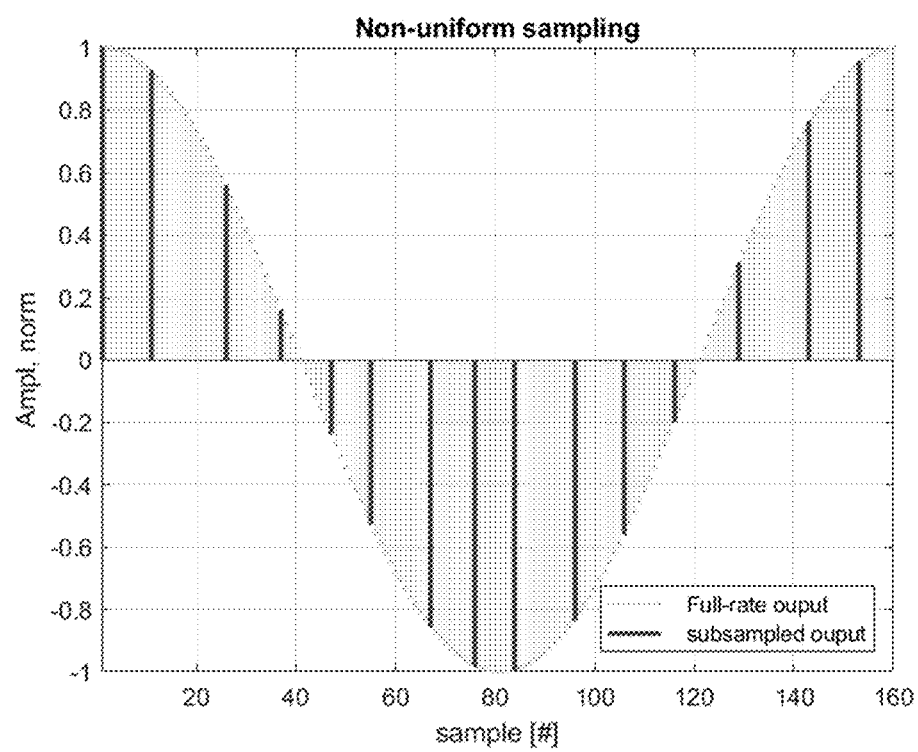
Figure 7:
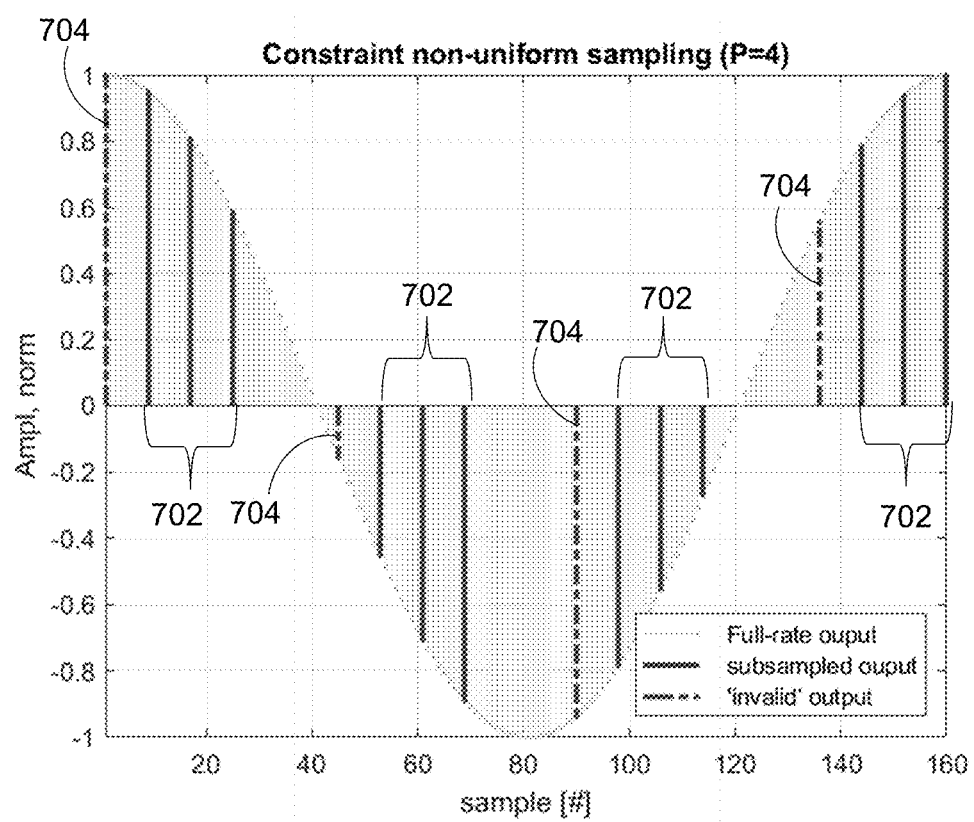
FIG. 7 shows an example of constrained non-uniform sampling with P=4 as an example.

Pure uniform sampling and pure non-uniform sampling are illustrated in FIGS. 5A and 5B, and combined uniform and non-uniform sampling is illustrated in FIG. 7, which will be explained in detail below. Under the uniform sampling, the sampling instants are regularly spaced, i.e., the sampling period between two subsequent samples is constant in time. Under the non-uniform sampling, the sampling period between two subsequent samples is randomly changed (increased or decreased). Combined uniform and non-uniform sampling is a hybrid sampling scheme where the sampling instants are both regularly and irregularly spaced each other.

The controller 340 may be configured to generate a second control signal indicating whether the digital data generated by the observation ADC 336 is valid or not. Digital data generated by the observation ADC 336 at non-uniform sampling instants is indicated as invalid and digital data generated by the observation ADC 336 at uniform sampling instants is indicated as valid. The observation path 330 includes a circuitry configured to block (discard) the digital data indicated as invalid and forward the digital data indicated as valid to the NLEQ in the receive path or to the DPD circuitry in the transmit path based on the second control signal.

In some examples, in generating the control signal, the controller 340 may be configured to introduce a random delay value to a fixed sampling period at every predetermined number of sampling instants. For example, the controller 340 may generate the control signal to activate the observation ADC 336 to sample every fourth sample with an additional random delay in addition to a fixed delay while other three samples are sampled only with the fixed delay. In some examples, the controller 340 may include a linear feedback shift register (LFSR) to generate the random delay. In some examples, the controller 340 may be configured to activate the observation ADC at a fraction of sampling rate of an ADC in the main receive path 320 or a DAC in the transmit path 310.

In accordance with the examples, in order to implement the constrained non-uniform sampling, compared to the transceiver shown in FIG. 1, no changes are needed in any analog circuities in the transceiver, but only the logic activating the sampler in the observation ADC and delivering the data to the digital backend need to be changed. The implementation of the constrained non-uniform sampling in accordance with the examples disclosed herein needs only a negligible increase of the silicon area (a few more gates in the digital controller) and no increase in the power dissipation.

Figure 4:
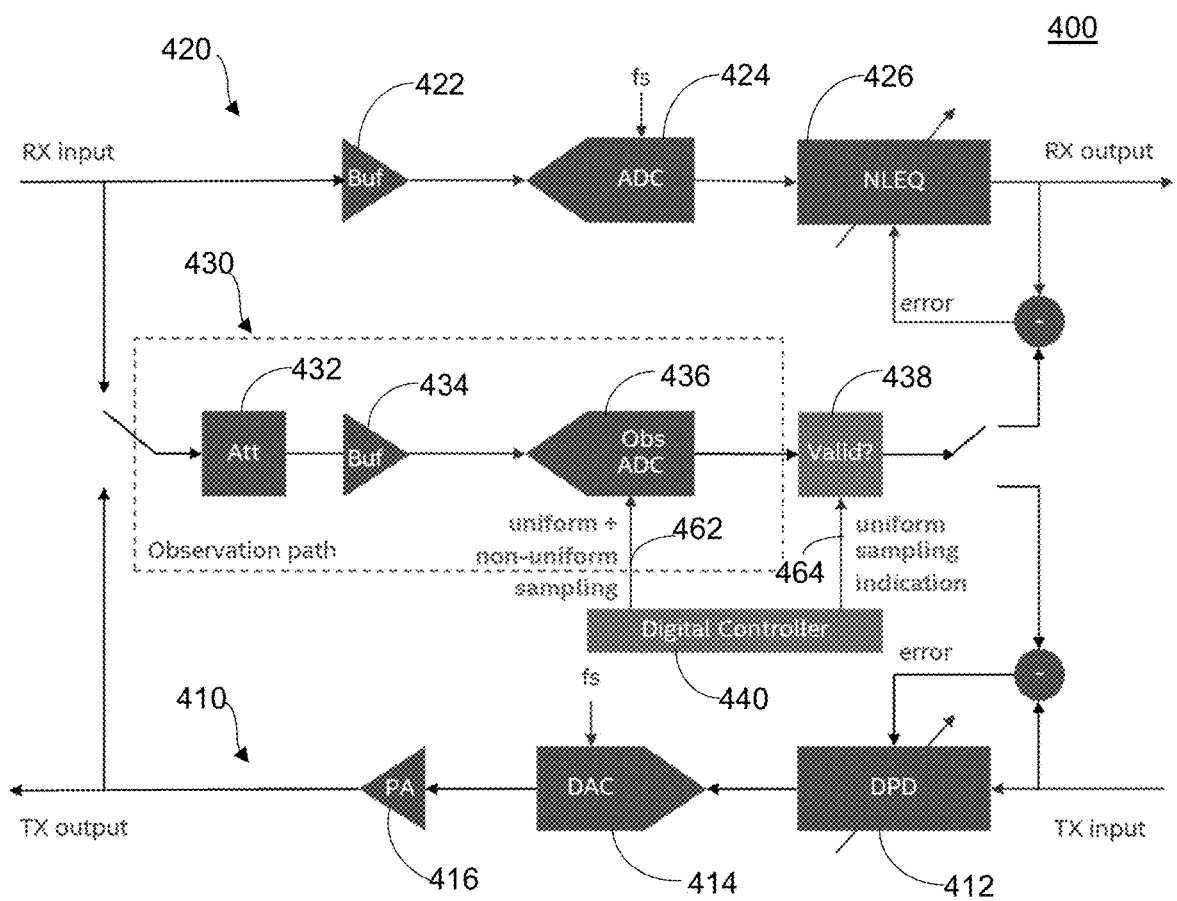
FIG. 4 is a block diagram of an example transceiver configured to implement constrained non-uniform sampling in the observation path in accordance with one example.

FIG. 4 is a block diagram of an example transceiver 400 configured to implement constrained non-uniform sampling in the observation path 430 in accordance with one example. The transceiver 400 includes a transmit path 410, a receive path 420, and an observation path 430.

The transmit path 410 includes a DPD circuit 412, a DAC 414, and a PA 416. The DPD circuit 412 pre-distorts the transmit signal based on the reference signal received from the observation path 430 to compensate for the non-linear effects caused to the transmit signal by the PA 416. The pre-distorted transmit signal is converted to an analog signal by the DAC 414 and amplified by the PA 416 for transmission.

The receive path 420 includes a buffer 422 (analog buffer), an ADC 424, and an NLEQ circuit 426. The buffer 422 delivers the received signal to the ADC 424. The ADC 424 digitizes the received signal. The NLEQ circuit 426 corrects a distortion incurred to the receive signal based on the reference signal from the observation path 430.

The observation path 430 may include an attenuator 432, a buffer 434 (analog buffer), and an ADC 436. The observation path 430 may be one of a plurality of receive paths 420 included in the transceiver 400. Alternatively, the observation path 430 may be a separate signal processing path dedicated for the calibration purposes. Either the transmit signal or the received signal is tapped onto the observation path 430 as a reference signal and converted to a digital signal by the ADC 436 for calibration of the transmit path 410 and/or the receive path 420 in a digital domain. The attenuator 432 attenuates the power of the reference signal on the observation path. The buffer 434 delivers the reference signal to the observation ADC 436. The observation ADC 436 samples and digitizes the reference signal and provides the digitized reference signal either to the DPD adaptation circuit in the transmit path 410 or to the NLEQ adaptation circuit in the receive path 420. The DPD is adaptively controlled based on the error between the reference signal and the transmit signal. The NLEQ is also adaptively controlled based on the error between the reference signal and the received signal.

In accordance with examples disclosed herein, the controller 440 controls sampling events at the observation ADC 436 such that the observation ADC 436 is activated at combined uniform and non-uniform sampling instants (i.e. constrained non-uniform sampling).

FIGS. 5A and 5B show pure uniform sampling and pure non-uniform sampling, respectively. The waveform represents the signal at the input of the observation path 430. FIGS. 5A and 5B show only one period of a continuous wave for simplicity. The thin vertical lines in FIGS. 5A and 5B represent the samples sampled at the full rate fs, as it would be captured by the main RX ADC 424 or generated by the main TX DAC 414. The thick vertical lines in FIGS. 5A and 5B represent the subsampled version of the same signal, that is acquired by the observation ADC 436.

FIG. 5A shows uniform sampling, where the sampling period is N/fs. Under the uniform sampling, the sampling instants are regularly spaced, i.e., the sampling period between two subsequent samples is constant in time. FIG. 5B shows non-uniform sampling. Under the non-uniform sampling, the sampling period between two subsequent samples is randomly changed (increased or decreased). In case of non-uniform sampling, a minimum sampling period need to be guaranteed depending on the actual implementation of the observation ADC.

Figure 6:
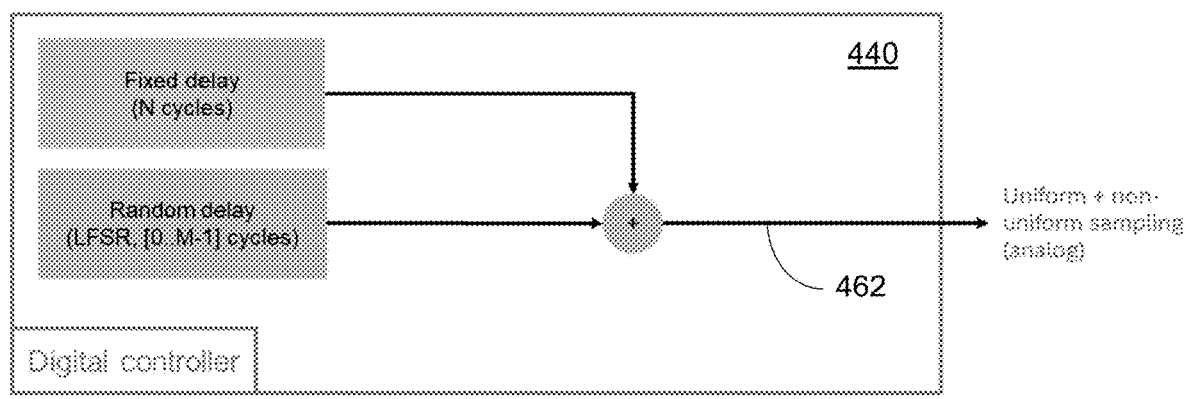
FIG. 6 is a schematic diagram of the controller configured to implement uniform or non-uniform sampling in accordance with one example.

FIG. 6 is a schematic diagram of the controller 440 configured to implement uniform or pure non-uniform sampling in accordance with one example. In examples disclosed herein, the controller 440 generates a control signal 462 for activating the observation ADC 436 under uniform or pure non-uniform sampling. Under the pure non-uniform sampling, at each sampling instant, a random delay of $m_i$ may be added to a fixed delay (N cycles in this example). In one example, the random delay may be generated by a multi-bit linear feedback shift register (LFSR), generating a delay with a uniform distribution. Alternatively, any other distributions may be used for generation/determination of the random delay, such as an exponentially increasing or decreasing distribution.

The random delay $m_i$ may be uniformly distributed within the range [0 . . . M−1]. The random delay value may be a positive number. Alternatively, the random delay value may be a positive number, zero, or a negative number as long as the sampling period for the observation ADC that is controlled by the control signal is at least the minimum delay period required for the observation ADC 436. For example, if the fixed delay is set to a higher value greater than the minimum delay period, the random delay value may be set to a negative value as well.

Under the above example uniform distribution of the delays $m_i$, the minimum sampling period is N, the maximum sampling period is N+M−1, and the average sampling period is $$N + \frac{M-1}{2}.$$

If M=1, the controller is configured to operate under uniform sampling. This may be simply achieved by bypassing the LFSR output and forcing it to 0.

In accordance with the combined uniform and non-uniform sampling scheme, some "regularity" is added to the pure non-uniform sampling to implement the constrained non-uniform sampling. In one example, the update of the random delay (i.e. the addition of the random delay to the fixed delay) may be triggered every P cycles, while the random delay is not added (e.g. a delay of 0 is added) during the other P−1 cycles. In this example, the non-uniform sampling occurs every P samples and the random delay of $m_i$ is added to the fixed delay of N every P cycles.

FIG. 7 shows an example of constrained non-uniform sampling with P=4 as an example. Similar to FIGS. 5A and 5B, FIG. 7 shows only one period of a continuous wave for simplicity. The thin vertical lines in FIG. 7 represent the samples obtained at the full rate fs, as it would be captured by the main RX ADC 424 or generated by the main TX DAC 414. The vertical lines 702, 704 in FIG. 7 represent the subsampled version of the same signal, that is acquired by the observation ADC 436. FIG. 7 shows that every fourth samples (dashed vertical lines 704) are sampled with a random delay added to the fixed delay and the three following samples (solid vertical lines 702) are sampled uniformly (in a regular sampling period).

During the sampling phase at p=1, the observation ADC 436 may be activated after a random period of $N+m_i$ cycles, N being a fixed delay and $m_i$ being a random delay. This random activation delay in the observation ADC 436 generates transients in the output of the analog buffer 434, which results in a random error to the amplitude of the sample and causes noise increase at the observation path output.

During the subsequent sampling phases p=[2 . . . P], the observation ADC 436 is activated after a fixed period of N cycles. Therefore, the buffer 434 preceding the observation ADC 436 sees a constant time-invariant load. Therefore, the amplitude of the samples would be free from errors. In the above example, every first sample within the cluster of P samples may not be delivered to the subsequent stage (e.g. DPD or NLEQ) and may be discarded. This will improve the quality of the observation path output signal.

Figure 8:
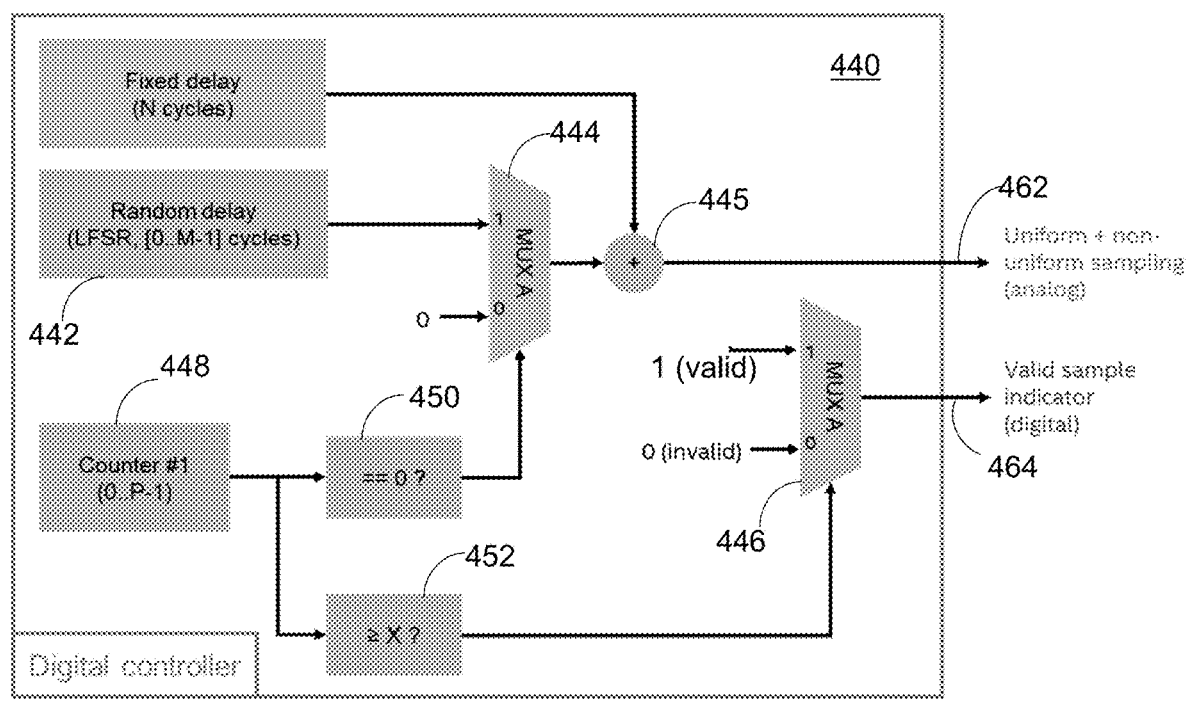
FIG. 8 is a block diagram of the controller configured to implement constrained non-uniform sampling in accordance with one example.

FIG. 8 is a block diagram of the controller 440 configured to implement constrained non-uniform sampling in accordance with one example. In this example, the controller 440 may include a random delay value generation circuit 442 (e.g. an LFSR), two multiplexers 444, 446, a counter 448, and two logical operation blocks 450, 452. The controller 440 may generate two different control signals 462, 464. The first control signal 462 is a sampling command for the observation ADC 436 and the second control signal 464 is a valid indicator.

The counter 448 controls the whole process. The counter 448 outputs integer count values. Every time the counter 448 is incremented, the controller 440 generates the sampling command (the first control signal 462) and new sampling is triggered in the observation ADC 436 based on the first control signal 462 (the sampling command). The first control signal 462 controls the sampling time instances at the observation ADC 436 such that the sampling at the observation ADC 436 may be uniformly or non-uniformly distributed over time. The range of the counter 448 is [0 . . . P−1]. The output value p of the counter 448 gets reset to 0 after reaching the maximum value of P−1.

For the generation of the sampling command 462 for the observation ADC 436, the first logical operation block 450 determines whether the output of the counter 448 equals to a predetermined value (in this example '0'). The first multiplexer 444 selects either the random delay value from the random delay value generation circuit 442 or '0' depending on the output of the first logical operation block 450. If the counter output p=0, a random increment $m_i$ from the random delay value generation circuit 442 is output by the first multiplexer 444 and added by the adder 445 to the fixed delay N. If the counter output p is not equal to 0, the random delay is bypassed to 0 by the first multiplexer 444 and the fixed delay N is output. The sampling command 462 is sent to the observation ADC 436 to control the sampling time instants at the observation ADC, i.e., the sampling at the observation ADC is triggered based on the sampling command 462.

For the generation of the valid indicator 464, the second logical operation block 452 compares the output of the counter 448 to a value X. The second multiplexer 446 outputs either 1 or 0, as the valid indicator 464, depending on the output of the second logical operation block 452. If the counter output p is equal to or greater than X, '1' is selected by the second multiplexer 446 and therefore the valid indicator is set to '1' and if the counter output p is smaller than X, '0' is selected by the second multiplexer 446 and the valid indicator is set to '0.' The use of the parameter X provides some flexibility as disclosed below. As an alternative example, instead of using the parameter X and the second logical operation block 454 and the second multiplexer 446, the output of the first logical operation block 450 may be used to derive the second control signal 464.

The valid indicator 464 controls the circuit 438 (shown in FIG. 4) in the observation path 430. The output of the observation ADC 436 may be forwarded to the NLEQ or DPD adaptation circuitry if the sample from the observation ADC 436 is obtained at the uniform sampling instants (i.e. no random delay is added to the fixed delay) and discarded if the sample is obtained by the observation ADC 436 under non-uniform sampling (i.e. the sampling instant is delayed further by the non-zero random delay). As an example, the circuit 438 may be a switch, a register, a latch, or the like that is controlled by the valid indicator 464 to propagate or block the data from the observation ADC 436.

Flexibility of the digital controller 440 may be achieved by setting the parameters X, P, and M properly. The parameter X controls the number of first samples to be discarded (marked as "invalid"). If X=0 the second logical operation block 452 is bypassed, and all samples will be used for the adaptation by the DPD and the NLEQ. If X=1, only the first sample is skipped (e.g. discarded), as previously described. The parameter X may be set to a value greater than 1, if needed. In such case, more than one first samples among a set of P samples will be discarded.

The parameter P controls how often the uniform (or non-uniform) sampling should occur. If P=1, the constrained non-uniform sampling is disabled, and the observation ADC 436 is activated under pure non-uniform sampling (i.e. the random delay value is always added to the fixed delay). For enabling the constrained non-uniform sampling, the parameter P is set to an integer value greater than 1 and the value P may be adjustable. The optimal value of the parameter P depends on the dynamic behavior of the input signal to be tracked.

The parameter M controls how the non-uniform sampling should occur. If M=1, the random delay is always '0' and only uniform sampling is activated. If the parameter M is set to an integer value greater than 1, the constrained non-uniform sampling is activated. The parameter M value is set depending on how large the maximum random delay would be.

Figure 9:
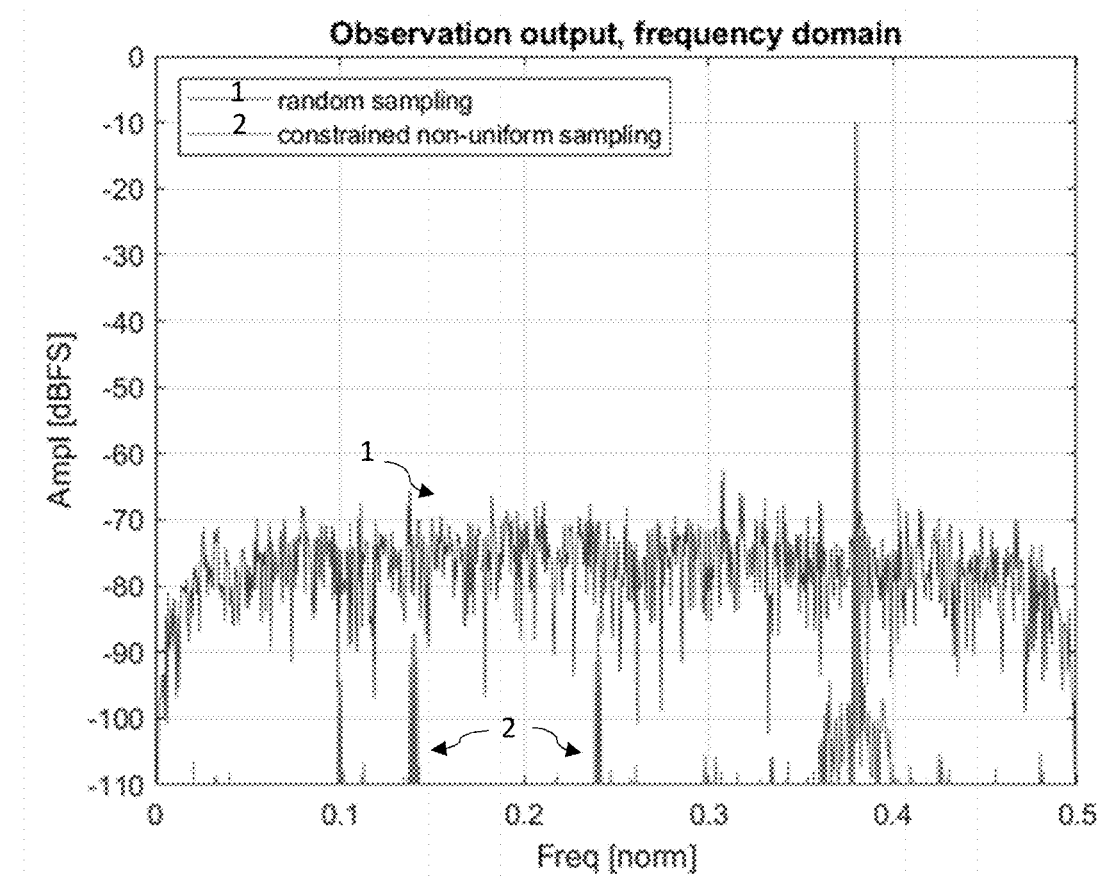
FIG. 9 shows performance comparison between the pure non-uniform sampling scheme and the constrained non-uniform sampling scheme in the RX chain.

FIG. 9 shows performance comparison between the pure non-uniform sampling scheme and the constrained non-uniform sampling scheme in the RX chain. FIG. 9 shows the impact on the overall performance through transistor-level simulations of the transceiver front-end. In this example, the spectrum at the observation output is observed during the RX adaptation under the non-uniform sampling and the constrained non-uniform sampling. In this simulation: N=16, M=4, P=4 and X=1. With the constrained non-uniform sampling scheme, the noise at the observation output can be significantly reduced (~35 dB reduction in the simulated testcase). The spurious-free dynamic range (SFDR) in the case of constrained non-uniform sampling is limited by residual buffer non-linearities but not anymore by noise.

Figure 10:
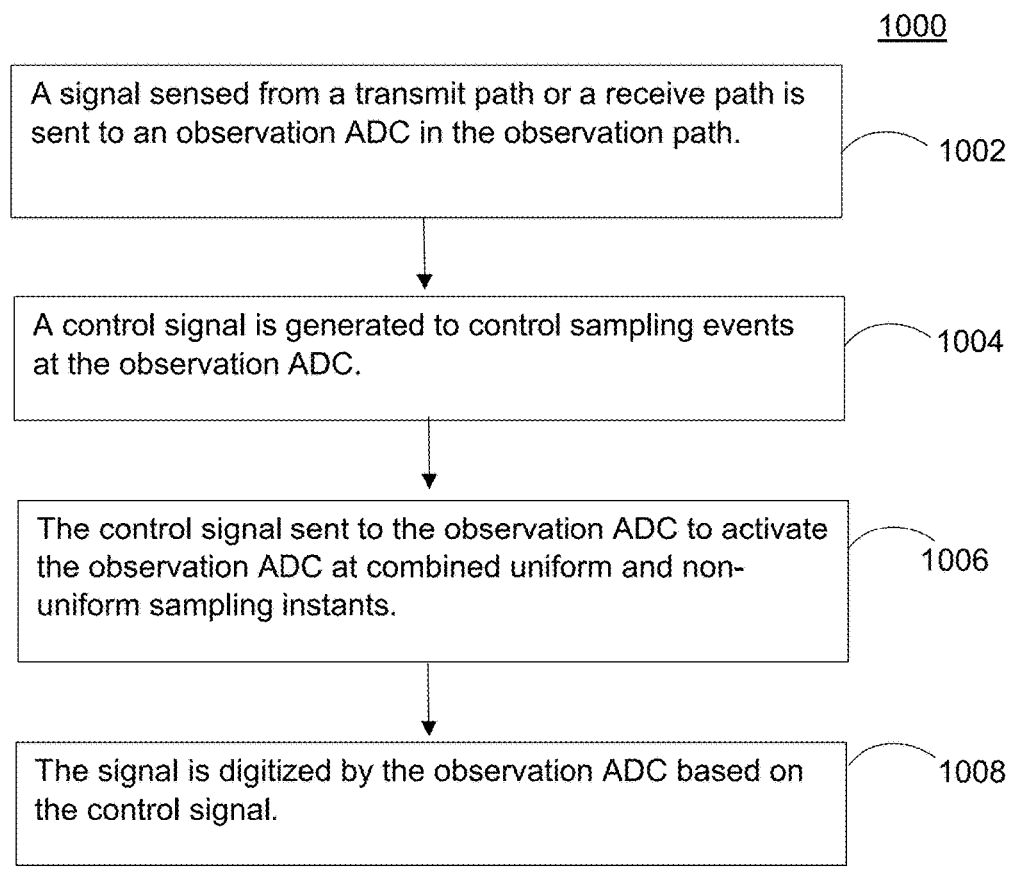
FIG. 10 is a flow diagram of a process for controlling an ADC in an observation path in a transceiver in accordance with one example.

FIG. 10 is a flow diagram of a process 1000 for controlling an ADC in an observation path in a transceiver in accordance with one example. A signal sensed from a transmit path or a receive path is sent to an observation ADC in the observation path (1002). A control signal is generated to control sampling events at the observation ADC (1004). The control signal is sent to the observation ADC to activate the observation ADC at combined uniform and non-uniform sampling instants (1006). The signal is digitized by the observation ADC in the observation path based on the control signal (1008).

A second control signal indicating whether digital data obtained by the observation ADC is valid or not may be generated. The digital data generated by the observation ADC at non-uniform sampling instants is indicated as invalid and digital data generated by the observation ADC at uniform sampling instants is indicated as valid. The digital data indicated as invalid is discarded and the digital data indicated as valid is forwarded to an NLEQ in the receive path or to a DPD circuitry in the transmit path.

Figure 11:
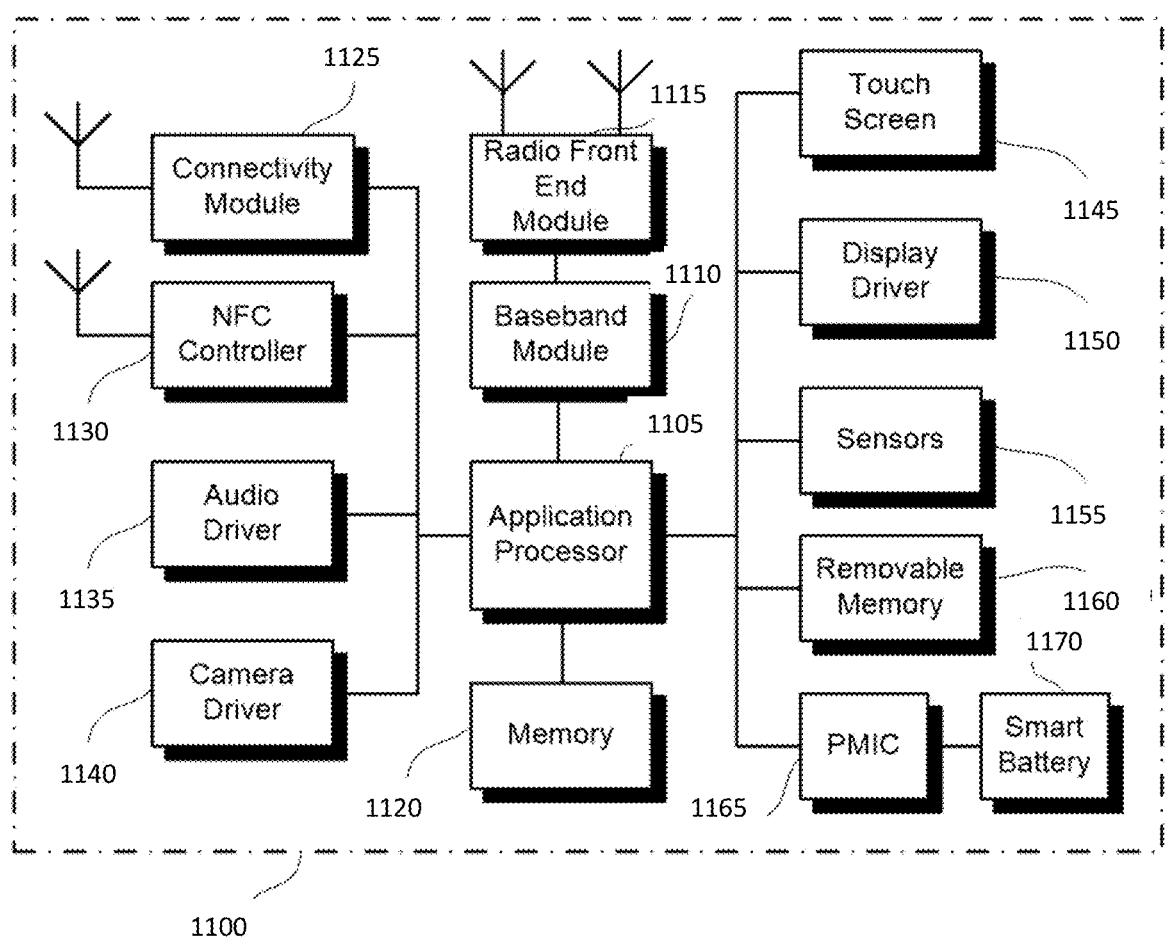
FIG. 11 illustrates a user device in which the examples disclosed herein may be implemented.

FIG. 11 illustrates a user device 1100 in which the examples disclosed herein may be implemented. For example, the examples disclosed herein may be implemented in the radio front-end module 1115, in the baseband module 1110, etc. The user device 1100 may be a mobile device in some aspects and includes an application processor 1105, baseband processor 1110 (also referred to as a baseband module), radio front end module (RFEM) 1115, memory 1120, connectivity module 1125, near field communication (NFC) controller 1130, audio driver 1135, camera driver 1140, touch screen 1145, display driver 1150, sensors 1155, removable memory 1160, power management integrated circuit (PMIC) 1165 and smart battery 1170.

In some aspects, application processor 1105 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1110 may be implemented, for example, as a solder-down substrate including one or more integrated circuits, a single packaged integrated circuit soldered to a main circuit board, and/or a multi-chip module containing two or more integrated circuits.

Figure 12:
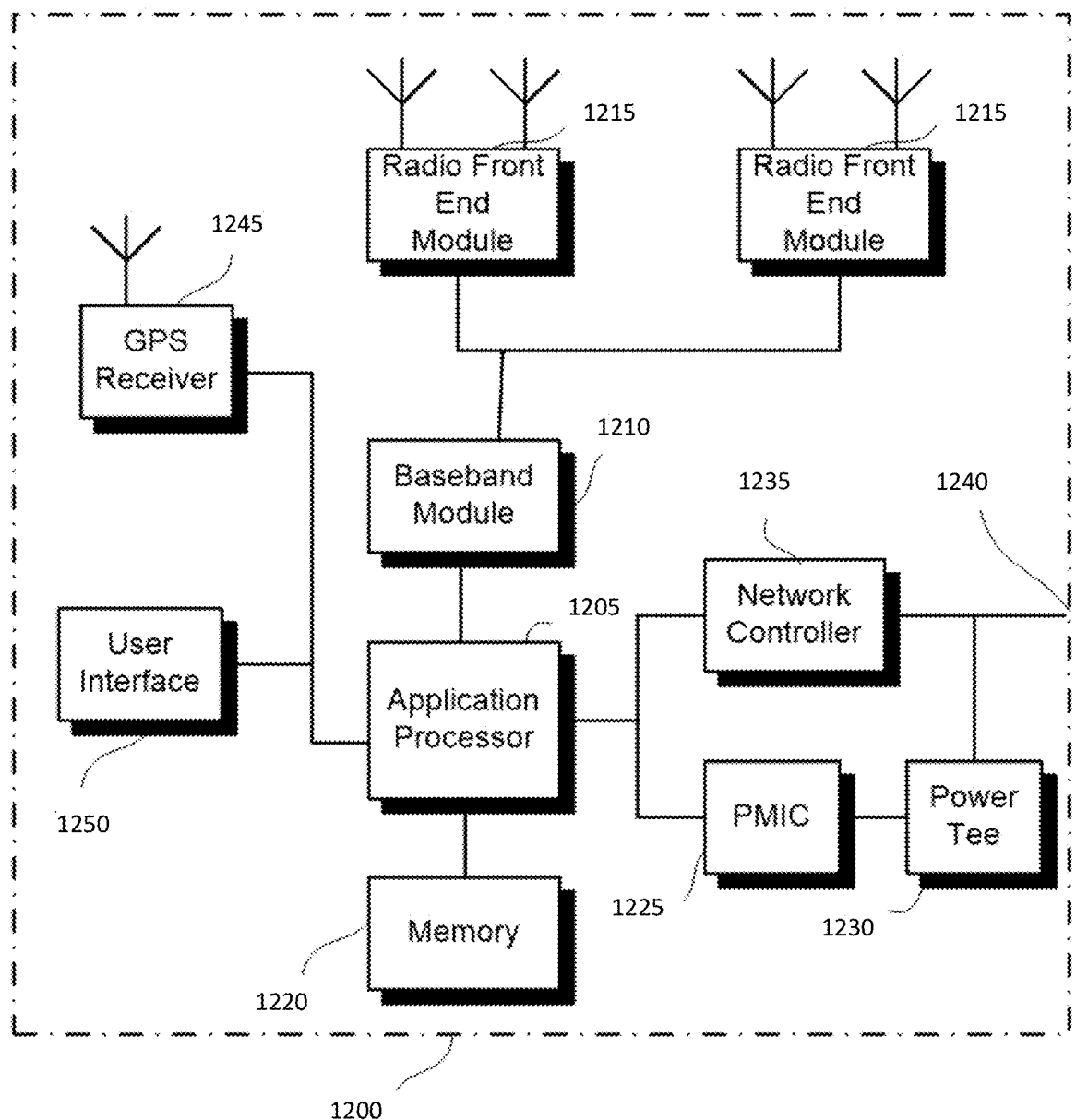
FIG. 12 illustrates a base station or infrastructure equipment radio head 1200 in which the examples disclosed herein may be implemented.

FIG. 12 illustrates a base station or infrastructure equipment radio head 1200 in which the examples disclosed herein may be implemented. For example, the examples disclosed herein may be implemented in the radio front-end module 1215, in the baseband module 1210, etc. The base station radio head 1200 may include one or more of application processor 1205, baseband modules 1210, one or more radio front end modules 1215, memory 1220, power management circuitry 1225, power tee circuitry 1230, network controller 1235, network interface connector 1240, satellite navigation receiver module 1245, and user interface 1250.

In some aspects, application processor 1205 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1210 may be implemented, for example, as a solder-down substrate including one or more integrated circuits, a single packaged integrated circuit soldered to a main circuit board or a multi-chip module containing two or more integrated circuits.

In some aspects, memory 1220 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1220 may be implemented as one or more of solder down packaged integrated circuits, socketed memory modules and plug-in memory cards.

In some aspects, power management integrated circuitry 1225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1230 may provide for electrical power drawn from a network cable to provide both power supply and data connectivity to the base station radio head 1200 using a single cable.

In some aspects, network controller 1235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1245 may provide data to application processor 1205 which may include one or more of position data or time data. Application processor 1205 may use time data to synchronize operations with other radio base stations.

In some aspects, user interface 1250 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is a transceiver. The transceiver comprises a transmit path including circuitries configured to process a transmit signal, a receive path including circuitries configured to process a receive signal, an observation path including circuitries configured to supply a reference signal for calibration of the transmit path and/or the receive path. The observation path includes an analog buffer configured to supply a signal sensed from the transmit path or the receive path, and an observation ADC configured to digitize the signal supplied from the analog buffer. The transceiver includes a controller configured to generate a first control signal to control sampling events at the observation ADC and send the first control signal to the observation ADC to activate the observation ADC at combined uniform and non-uniform sampling instants.

Example 2 is the transceiver of example 1, wherein the controller is configured to generate a second control signal indicating whether digital data obtained by the observation ADC is valid or not, wherein digital data generated by the observation ADC at non-uniform sampling instants is indicated as invalid and digital data generated by the observation ADC at uniform sampling instants is indicated as valid.

Example 3 is the transceiver of example 2, wherein the observation path further includes a circuitry configured to discard the digital data indicated as invalid and forward the digital data indicated as valid to a non-linear equalizer in the receive path or to a digital pre-distortion circuitry in the transmit path based on the second control signal.

Example 4 is the transceiver as in any one of examples 1-3, wherein the controller is configured to add a random delay value to a fixed sampling period at every predetermined number of sampling instants to generate the first control signal.

Example 5 is the transceiver of example 4, wherein the controller includes a LFSR to generate the random delay value.

Example 6 is the transceiver as in any one of examples 1-5, wherein the controller is configured to activate the observation ADC at a fraction of sampling rate of an ADC in a main receive path or a DAC in a transmit path.

Example 7 is the transceiver as in any one of examples 2-6, wherein the controller comprises a random delay value generation circuit configured to generate a random delay value, a counter configured to generate an integer count value, a logic circuit configured determine whether the integer count value is equal to a predetermined value, a multiplexer configured to output either the random delay value or zero depending on an output of the logic circuit, and an adder configured to add a fixed delay value to an output of the multiplexer to generate the first control signal. The random delay value is selected by the multiplexer if the integer count value is equal to the predetermined value and zero is selected by the multiplexer if the integer count value is not equal to the predetermined value.

Example 8 is the transceiver of example 7, wherein the controller further comprises a second logic circuit configured to determine whether the integer count value is equal to or greater than a second predetermined value, and a second multiplexer configured to output either zero or one as the second control signal based on an output of the second logic circuit.

Example 9 is the transceiver as in any one of examples 7-8, wherein the counter is configured to generate the integer count value within a range from zero to P−1, wherein the parameter P is adjustable.

Example 10 is the transceiver as in any one of examples 7-9, wherein the random delay value generation circuit is configured to generate the random delay value within a range from zero to M−1, wherein the parameter M is adjustable.

Example 11 is a method for controlling an ADC in an observation path in a transceiver. The method includes supplying a signal sensed from a transmit path or a receive path to an observation ADC in the observation path, generating a first control signal to control sampling events at the observation ADC, sending the first control signal to the observation ADC to activate the observation ADC at combined uniform and non-uniform sampling instants, and digitizing, by the observation ADC, the signal supplied based on the first control signal.

Example 12 is the method of example 11, further comprising generating a second control signal indicating whether digital data generated by the observation ADC is valid or not, wherein digital data generated by the observation ADC at non-uniform sampling instants is indicated as invalid and digital data generated by the observation ADC at uniform sampling instants is indicated as valid, discarding the digital data indicated as invalid, and forwarding the digital data indicated as valid to a non-linear equalizer in the receive path or to a digital pre-distortion circuitry in the transmit path.

Example 13 is the method as in any one of examples 11-12, wherein the first control signal is generated by introducing a random delay value to a fixed sampling period at every predetermined number of sampling instants.

Example 14 is the method of example 13, wherein the random delay value is generated by a LFSR.

Example 15 is the method as in any one of examples 11-14, wherein the observation ADC is activated at a fraction of sampling rate of an ADC in a main receive path or a DAC in a transmit path.

Example 16 is the method as in any one of examples 12-15, wherein the first control signal is generated by generating a random delay value, generating an integer count value, determining, by a first logic circuit, whether the integer count value is equal to a predetermined value, outputting, by a multiplexer, either the random delay value or zero depending on an output of the first logic circuit, wherein the random delay value is output if the integer count value is equal to the predetermined value and zero is output if the integer count value is not equal to the predetermined value, and adding a fixed delay value to an output of the multiplexer to generate the first control signal.

Example 17 is the method of example 16, wherein the second control signal is generated by determining, by a second logic circuit, whether the integer count value is equal to or greater than a second predetermined value, and outputting either zero or one as the second control signal based on an output of the second logic circuit.

Example 18 is a system for controlling an ADC in an observation path in a transceiver. The system includes a controller configured to generate a control signal to control sampling events at an ADC and send the control signal to the ADC to activate the ADC at combined uniform and non-uniform sampling instants.

Example 19 is the system of example 18, wherein the controller is configured to indicate digital data generated by the ADC at non-uniform sampling instants as invalid and digital data generated by the ADC at uniform sampling instants as valid.

Example 20 is the system as in any one of examples 18-19, wherein the controller comprises a random delay value generation circuit configured to generate a random delay value, a counter configured to output an integer count value, a logic circuit configured determine whether the integer count value is equal to a predetermined value, a multiplexer configured to output either the random delay value or zero depending on an output of the logic circuit, wherein the random delay value is selected if the output of the counter is equal to the predetermined value and zero is selected if the output of the counter is not equal to the predetermined value, and an adder configured to add a fixed delay value to an output of the multiplexer.

Example 21 is the system of example 20, further comprising a second logic circuit configured to determine whether the integer count value is equal to or greater than a second predetermined value, and a second multiplexer configured to output either zero or one as the second control signal based on an output of the second logic circuit.

Example 22 is a method for controlling an ADC in an observation path in a transceiver. The method includes generating a control signal to control sampling events at an ADC in the observation path in the transceiver, and sending the control signal to the ADC to activate the ADC at combined uniform and non-uniform sampling instants.

Example 23 is the method of example 22, further comprising indicating digital data generated by the ADC at non-uniform sampling instants as invalid and indicating digital data generated by the ADC at uniform sampling instants as valid.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A transceiver comprising:
   a transmit path including circuitries configured to process a transmit signal;
   a receive path including circuitries configured to process a receive signal;
   an observation path including circuitries configured to supply a reference signal for calibration of the transmit path and/or the receive path, wherein the observation path includes:
      an analog buffer configured to supply a signal sensed from the transmit path or the receive path; and
      an observation analog-to-digital converter (ADC) configured to digitize the signal supplied from the analog buffer, and
   a controller configured to generate a first control signal to control sampling events at the observation ADC and send the first control signal to the observation ADC to activate the observation ADC at combined uniform and non-uniform sampling instants.

2. The transceiver of claim 1, wherein the controller is configured to generate a second control signal indicating whether digital data obtained by the observation ADC is valid or not, wherein digital data generated by the observation ADC at non-uniform sampling instants is indicated as invalid and digital data generated by the observation ADC at uniform sampling instants is indicated as valid.

3. The transceiver of claim 2, wherein the observation path further includes a circuitry configured to discard the digital data indicated as invalid and forward the digital data indicated as valid to a non-linear equalizer in the receive path or to a digital pre-distortion circuitry in the transmit path based on the second control signal.

4. The transceiver of claim 1, wherein the controller is configured to add a random delay value to a fixed sampling period at every predetermined number of sampling instants to generate the first control signal.

5. The transceiver of claim 4, wherein the controller includes a linear feedback shift register (LFSR) to generate the random delay value.

6. The transceiver of claim 1, wherein the controller is configured to activate the observation ADC at a fraction of sampling rate of an ADC in a main receive path or a digital-to-analog converter (DAC) in a transmit path.

7. The transceiver of claim 2, wherein the controller comprises:
   a random delay value generation circuit configured to generate a random delay value;
   a counter configured to generate an integer count value;
   a logic circuit configured determine whether the integer count value is equal to a predetermined value;
   a multiplexer configured to output either the random delay value or zero depending on an output of the logic circuit, wherein the random delay value is selected by the multiplexer if the integer count value is equal to the predetermined value and zero is selected by the multiplexer if the integer count value is not equal to the predetermined value; and
   an adder configured to add a fixed delay value to an output of the multiplexer to generate the first control signal.

8. The transceiver of claim 7, wherein the controller further comprises:
   a second logic circuit configured to determine whether the integer count value is equal to or greater than a second predetermined value; and
   a second multiplexer configured to output either zero or one as the second control signal based on an output of the second logic circuit.

9. The transceiver of claim 7, wherein the counter is configured to generate the integer count value within a range from zero to P−1, wherein the parameter P is adjustable.

10. The transceiver of claim 7, wherein the random delay value generation circuit is configured to generate the random delay value within a range from zero to M−1, wherein the parameter M is adjustable.

11. A method for controlling an analog-to-digital converter (ADC) in an observation path in a transceiver, comprising:
    supplying a signal sensed from a transmit path or a receive path to an observation ADC in the observation path;
    generating a first control signal to control sampling events at the observation ADC;
    sending the first control signal to the observation ADC to activate the observation ADC at combined uniform and non-uniform sampling instants; and
    digitizing, by the observation ADC, the signal supplied based on the first control signal.

12. The method of claim 11, further comprising:
    generating a second control signal indicating whether digital data generated by the observation ADC is valid or not, wherein digital data generated by the observation ADC at non-uniform sampling instants is indicated as invalid and digital data generated by the observation ADC at uniform sampling instants is indicated as valid;
    discarding the digital data indicated as invalid; and
    forwarding the digital data indicated as valid to a non-linear equalizer in the receive path or to a digital pre-distortion circuitry in the transmit path.

13. The method of claim 11, wherein the first control signal is generated by introducing a random delay value to a fixed sampling period at every predetermined number of sampling instants.

14. The method of claim 13, wherein the random delay value is generated by a linear feedback shift register (LFSR).

15. The method of claim 11, wherein the observation ADC is activated at a fraction of sampling rate of an ADC in a main receive path or a digital-to-analog converter (DAC) in a transmit path.

16. The method of claim 12, wherein the first control signal is generated by:
    generating a random delay value;
    generating an integer count value;
    determining, by a first logic circuit, whether the integer count value is equal to a predetermined value;
    outputting, by a multiplexer, either the random delay value or zero depending on an output of the first logic circuit, wherein the random delay value is output if the integer count value is equal to the predetermined value and zero is output if the integer count value is not equal to the predetermined value; and
    adding a fixed delay value to an output of the multiplexer to generate the first control signal.

17. The method of claim 16, wherein the second control signal is generated by:
    determining, by a second logic circuit, whether the integer count value is equal to or greater than a second predetermined value; and
    outputting either zero or one as the second control signal based on an output of the second logic circuit.

18. A system for controlling an analog-to-digital converter (ADC) in an observation path in a transceiver, comprising:
a controller configured to generate a control signal to control sampling events at an ADC and send the control signal to the ADC to activate the ADC at combined uniform and non-uniform sampling instants.

19. The system of claim 18, wherein the controller is configured to indicate digital data generated by the ADC at non-uniform sampling instants as invalid and digital data generated by the ADC at uniform sampling instants as valid.

20. The system of claim 18, wherein the controller comprises:
a random delay value generation circuit configured to generate a random delay value;
a counter configured to output an integer count value;
a logic circuit configured determine whether the integer count value is equal to a predetermined value;
a multiplexer configured to output either the random delay value or zero depending on an output of the logic circuit, wherein the random delay value is selected if the output of the counter is equal to the predetermined value and zero is selected if the output of the counter is not equal to the predetermined value; and
an adder configured to add a fixed delay value to an output of the multiplexer.

21. The system of claim 20, further comprising:
a second logic circuit configured to determine whether the integer count value is equal to or greater than a second predetermined value; and
a second multiplexer configured to output either zero or one as the second control signal based on an output of the second logic circuit.

22. A method for controlling an analog-to-digital converter (ADC) in an observation path in a transceiver, comprising:
generating a control signal to control sampling events at an ADC in the observation path in the transceiver; and
sending the control signal to the ADC to activate the ADC at combined uniform and non-uniform sampling instants.

23. The method of claim 22, further comprising:
indicating digital data generated by the ADC at non-uniform sampling instants as invalid and indicating digital data generated by the ADC at uniform sampling instants as valid.

* * * * *